United States Patent
Morand et al.

(10) Patent No.: US 7,692,262 B2
(45) Date of Patent: Apr. 6, 2010

(54) RECTIFYING AND PROTECTION DIODE

(75) Inventors: Jean-Luc Morand, Tours (FR);
Emmanuel Collard, Tours (FR); André Lhorte, Saint Averin (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/885,996

(22) Filed: Jul. 7, 2004

(65) Prior Publication Data

US 2005/0006662 A1 Jan. 13, 2005

(30) Foreign Application Priority Data

Jul. 11, 2003 (FR) .................................. 03 50325

(51) Int. Cl.
*H01L 27/095* (2006.01)
*H01L 29/74* (2006.01)

(52) U.S. Cl. .................. 257/484; 257/112; 257/155; 257/475; 257/483; 257/494

(58) Field of Classification Search .................. 257/46, 257/104, 106, 112, 155, 260, 267, 280, 471–474, 257/480–485, 475, 478, 490, 928, 494–496; 438/92, 167, 570–572
See application file for complete search history.

(56) References Cited

U.S. PATENT DOCUMENTS

| | | | | | |
|---|---|---|---|---|---|
| 4,738,936 | A | * | 4/1988 | Rice | 438/286 |
| 4,998,148 | A | * | 3/1991 | Essaff | 257/547 |
| 5,412,243 | A | * | 5/1995 | Morishita | 257/462 |
| 5,888,891 | A | * | 3/1999 | Gould | 438/575 |
| 6,049,108 | A | * | 4/2000 | Williams et al. | 257/341 |
| 6,175,143 | B1 | * | 1/2001 | Fujihira et al. | 257/471 |
| 6,600,182 | B2 | * | 7/2003 | Rumennik | 257/288 |
| 6,639,301 | B2 | * | 10/2003 | Andoh | 257/606 |
| 7,102,207 | B2 | * | 9/2006 | Inoue et al. | 257/656 |
| 7,129,558 | B2 | * | 10/2006 | Skocki | 257/484 |
| 2002/0008237 | A1 | * | 1/2002 | Chang et al. | 257/54 |
| 2002/0070380 | A1 | | 6/2002 | Andoh | |

OTHER PUBLICATIONS

French Search Report from French Patent Application 03/50325, filed Jul. 11, 2003.
Manoj Mehrotra et al., "Low Forward Drop JBS Rectifiers Fabricated Using Submicron Technology" IEEE Transactions On Electron Devices, IEEE Inc., New York, US, vol. 41, No. 9, Sep. 1, 1994, pp. 1655-1660, XP000466807 ISSN: 0018-9383.

(Continued)

*Primary Examiner*—Ori Nadav
(74) *Attorney, Agent, or Firm*—Lisa K. Jorgenson; James H. Morris; Wolf, Greenfield & Sacks, P.C.

(57) ABSTRACT

A vertical rectifying and protection power diode, formed in a lightly-doped semiconductor layer of a first conductivity type, resting on a heavily-doped substrate of the first conductivity type, having a first ring-shaped region, of the first conductivity type more heavily-doped than the layer and more lightly doped than the substrate, surrounding an area of the layer and extending to the substrate; and a second ring-shaped region, doped of the second conductivity type, extending at the surface of the first region and on either side thereof; a first electrode having a thin layer of a material capable of forming a Schottky diode with the layer, resting on the area of the layer and on at least a portion of the second ring-shaped region with which it forms an ohmic contact.

9 Claims, 2 Drawing Sheets

OTHER PUBLICATIONS

Hefner A., et al., "Silicon Carbide Merged PiN Schottky Diode Switching Characteristics and Evaluation For Power Supply Applications" Conference Proceedings Article, vol. 5, Oct. 8, 2000, pp. 2948-2954.

* cited by examiner

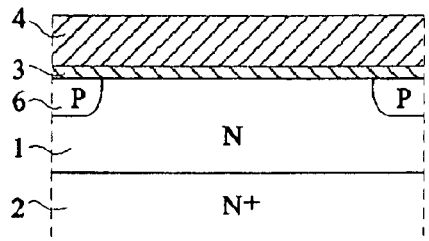
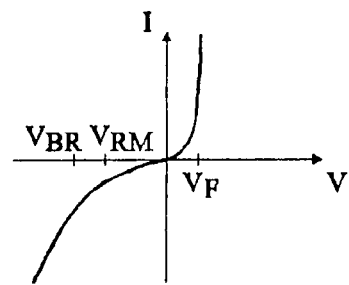
Fig. 1A
(Prior Art)
Fig. 1B
(Prior Art)
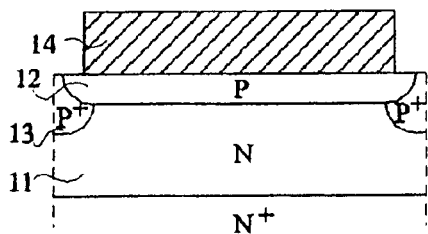
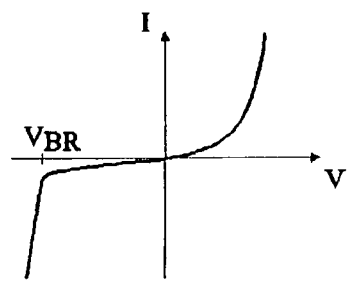
Fig. 2A
(Prior Art)
Fig. 2B
(Prior Art)

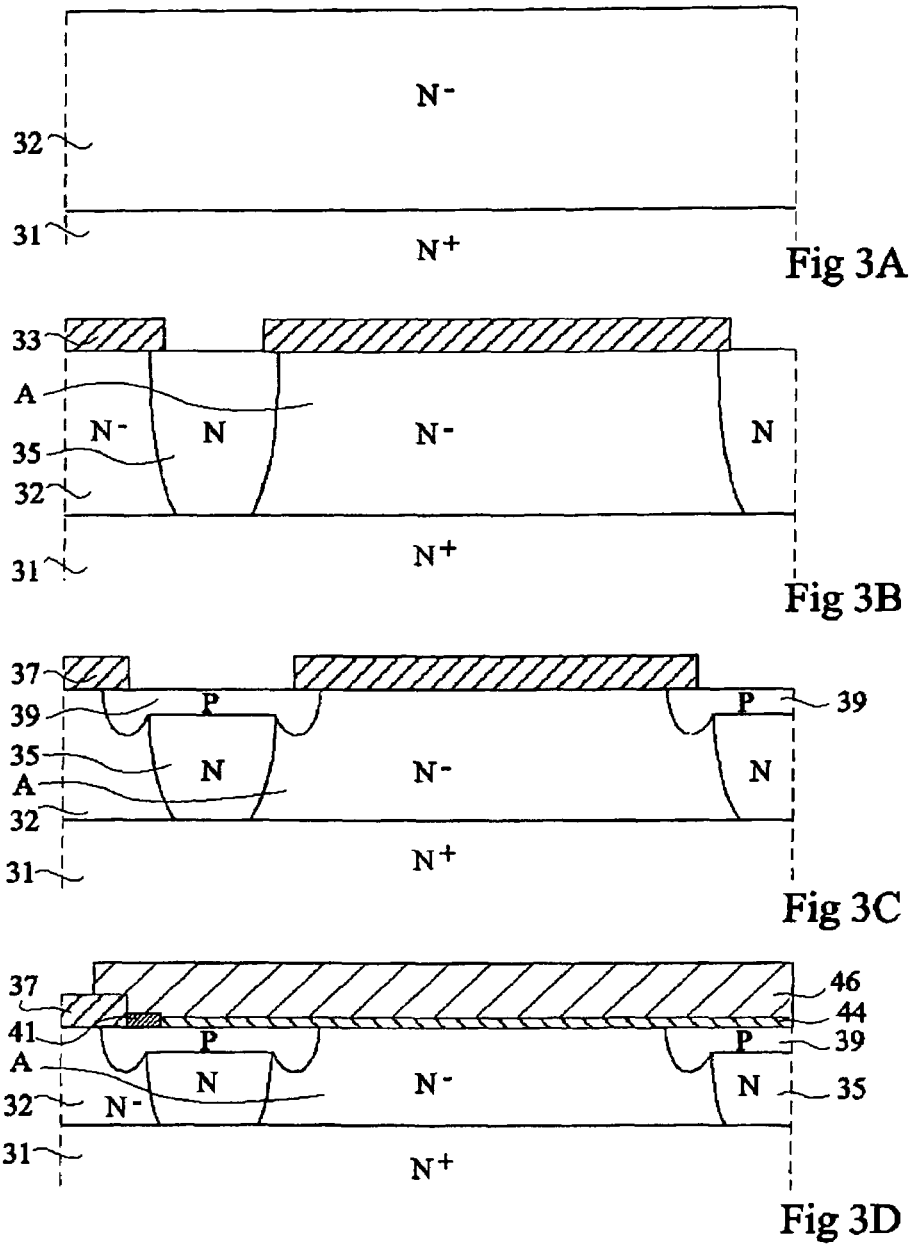
Fig 3A
Fig 3B
Fig 3C
Fig 3D
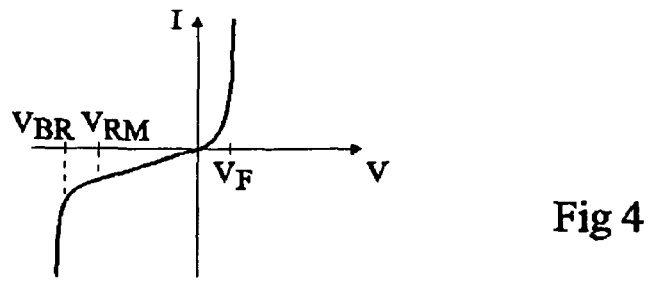
Fig 4

RECTIFYING AND PROTECTION DIODE

BACKGROUND OF THE INVENTION

1. Field of the Invention

The present invention relates to the field of vertical diodes intended for rectification and/or protection used, for example, in power supplies of portable devices such as photographic cameras, shooting cameras, electronic agendas, wireless and/or mobile telephones, or portable computers.

2. Discussion of the Related Art

In such applications, Schottky diodes or PN junction diodes are in particular used.

FIG. 1A illustrates, in partial simplified cross-section view, a vertical power diode of Schottky type. The Schottky diode is formed in a lightly-doped semiconductor layer 1 of a first conductivity type, generally N. Layer 1 rests upon an N-type substrate 2 more heavily doped than layer 1. Substrate 2 is covered at its rear surface with a cathode metallization (not shown). At its front surface, layer 1 is partially covered with a thin layer 3 of a material capable of forming a Schottky junction with layer 1. Layer 3 forms one piece with an anode metallization 4. The diode generally comprises a guard ring 6 formed by front surface diffusion at the surface of layer 1. It should be noted that guard ring 6 can be considered as forming a PN diode with layer 1, but that this PN diode is not optimized for a protection function.

FIG. 1B illustrates the shape of characteristic I(V) of a Schottky diode. A Schottky diode exhibits a small forward voltage drop $V_F$, generally smaller than 0.5 V, even for significant currents, that is, currents greater than 1 A. However, a Schottky diode has a poor behavior in reverse biasing, that is, the avalanche is unclear and reverse curve I(V) has a small slope, which results in that the voltage drop across the diode strongly increases when the reverse current flowing therethrough increases.

FIG. 2A is a simplified cross-section view of a vertical PN diode intended to ensure a protection function. The diode is formed in an N-type doped semiconductor substrate 11. At the rear surface, the diode comprises a heavily-doped N layer ($N^+$) coated with a cathode metallization (not shown). At the front surface, substrate 11 comprises a lightly-doped P-type region 12 generally surrounded with a very heavily-doped P-type ring-shaped region 13. A portion of region 12 is solid with an anode metallization 14.

As illustrated in FIG. 2B, a PN diode exhibits in reverse biasing a satisfactory avalanche behavior, that is, beyond an avalanche voltage $V_{BR}$, the slope of curve I(V) is very strong. However, in forward biasing, component 10 exhibits a relatively high voltage drop which varies along with the current. The doping of substrate 11 currently is on the order of from $10^{17}$ to $10^{18}$ at.cm$^{-3}$ to optimize the reverse breakdown characteristic.

Thus, in applications where the rectifying function, that is, the obtaining of a small forward voltage drop, is essential, Schottky-type diodes are preferably used. However, in applications where the protection function, that is, the obtaining of a substantially constant reverse voltage, is essential, PN-type diodes are preferably used.

However, in many application among which are supply converters and/or supply or charge protection in portable devices, it is desirable to optimize both the rectifying function and the protection function. Since the only way to obtain a small forward voltage drop, much smaller than 0.6 V, is to use a Schottky diode, such greatly oversized diodes have to be used to avoid that the reverse voltage excessively increases along with the reverse current increase, which inevitably results in that other parameters, and especially the leakage current, are altered. It is impossible, whit Schottky diodes as well as with PN-junction components, to improve the reverse of forward current behavior without disadvantageously affecting their forward or reverse, diode, respectively. Indeed, any doping modification modifies both behaviors.

SUMMARY OF THE INVENTION

The present invention aims at providing a vertical diode which exhibits both a small forward voltage drop and a characteristic with a steep slope in reverse biasing.

The present invention also aims at providing a method for forming such a diode.

To achieve these and other objects, the present invention provides a vertical rectifying and protection power diode, formed in a lightly-doped semiconductor layer of a first conductivity type, resting on a heavily-doped substrate of the conductivity type, comprising a first ring-shaped region, of the first conductivity type more heavily-doped than said layer and more lightly doped than said substrate, surrounding an area of said layer and extending to the substrate; and a second ring-shaped region, doped of the second conductivity type, extending at the surface of the first region and on either side thereof; a first electrode comprising a thin layer of a material capable of forming a Schottky diode with said layer, resting on said area of said layer and on at least a portion of the second ring-shaped region with which it forms an ohmic contact.

According to an embodiment of the present invention, the first conductivity type is type N and the second type is type P.

The present invention also provides a method for forming a vertical diode on a heavily-doped single-crystal silicon substrate of a first conductivity type, comprising the steps of forming on the substrate a semiconductor layer of the first conductivity type more lightly doped than the substrate; forming, in said layer, a first ring-shaped region extending to the substrate, the first ring-shaped region being doped of the first conductivity type more heavily than said layer and more lightly than said substrate; forming a second ring-shaped region, doped of the second conductivity type, extending at the surface of the first region and on either side thereof at the surface of the layer and of the area; and depositing, on said area of said layer and on a portion of the second ring-shaped region, a thin layer of a material capable of forming a Schottky junction with said layer.

According to an embodiment of the present invention, the method further comprises the steps of forming, at the rear surface, a metallization on at least a portion of the substrate and, at the front surface, another metallization on at least a portion of the thin layer.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 1A illustrates, in partial simplified cross-section view, a Schottky diode;

FIG. 1B schematically illustrates characteristic I(V) of a Schottky diode;

FIG. 2A illustrates, in partial simplified cross-section view, a PN-junction diode;

FIG. 2B schematically illustrates characteristic I(V) of a PN diode;

FIGS. 3A to 3D illustrate in partial simplified cross-section view steps of the forming of a diode according to an embodiment of the present invention; and FIG. 4 schematically illustrates characteristic I(V) of a diode according to the present invention.

DETAILED DESCRIPTION

For clarity, the different drawings are not drawn to scale. Further, in the various drawings, the same elements are designated with the same references.

FIGS. 3A to 3D illustrate, in partial simplified cross-section view, steps of a method for forming a vertical power diode according to an embodiment of the present invention.

As illustrated in FIG. 3A, thenmethod according to the present invention starts with the epitaxial growth, on a single-crystal silicon substrate 31, of a semiconductor layer 32. Substrate 31 is heavily N-type doped, while layer 32 is lightly N-type doped.

At the next steps, illustrated in FIG. 3B, a mask 33 with a ring-shaped opening through which is performed an implantation of an N-type doping such as phosphorus is deposited. An area A surrounded with a ring-shaped region 35 is thus defined in layer 32. The implantation and diffusion anneal conditions are chosen so that ring-shaped region 35 crosses the entire layer 32 and reaches substrate 31. Ring-shaped region 35 is more heavily N-type doped than area A (layer 32) but more lightly doped than substrate 31.

At the next steps, illustrated in FIG. 3C, mask 33 is removed and replaced with a mask 37 exhibiting a ring-shaped opening of dimensions greater than those of mask 33, around first ring-shaped region 35. A second P-type ring-shaped region 39 is then formed by implantation/diffusion. Second region 39 covers the upper surface of ring-shaped region 35 and extends on either side thereof, inwards and outwards. It should be noted that the portion of second region 39 extending outside of first region 35 results from a deeper diffusion than the central portion, which enhances the fact that the active PN junction is the junction at the interface between layers 35 and 39.

Then, as illustrated in FIG. 3D, the portion of mask 37 protecting the upper surface of area A is removed and an additional mask 41 intended to extend mask 37 inwards above an external portion of a ring-shaped region 35 is formed. Then, a thin layer 44 capable of forming a Schottky junction with area A is formed in the space left free by mask 37-41. Layer 44 covers the central and internal portions of ring-shaped region 39 with which it forms an ohmic contact. Then, a metallization 46 intended to form the anode of the rectifying and protection diode according to the present invention is formed on layer 44.

The method according to the present invention continues with usual component forming steps, especially the forming at the rear surface of substrate 31 of a metallization intended to form another electrode, here the cathode, of the diode according to the present invention.

A diode formed of a central Schottky junction 44-A in parallel with a peripheral PN junction 39-35 is thus obtained. The structure according to the present invention advantageously enables conciliating the diverging doping constraints of the Schottky and PN diodes.

FIG. 4 illustrates characteristic I(V) of a diode according to the present invention, for example, a structure similar to that of FIG. 3D. In forward biasing, the diode according to the present invention behaves as a Schottky diode 38-A and exhibits a relatively small voltage drop which depends on the doping level of area A and of the used Schottky metal. In reverse biasing, the diode behaves as a PN junction 39-35 and exhibits a steep avalanche behavior which essentially depends on the doping of first ring-shaped region 35. The dopings of area A (layer 32) and of first ring-shaped region 35 can advantageously be optimized to reduce or minimize the forward voltage drop and increase or maximize the reverse breakdown voltage by reducing reverse currents (the reverse power consumption), respectively.

As a non-limiting example, the different elements of FIG. 3D will exhibit the following characteristics:

substrate 31: single-crystal silicon, N-type doped with a concentration on the order of from $10^{19}$ to $10^{20}$ at./cm$^3$;

layer 32: initial thickness on the order of from 10 to 20 μm to obtain after anneal a thickness on the order of from 5 to 6 μm; N-type doping with a concentration on the order of from $10^{15}$ to $10^{16}$ at./cm$^3$;

ring-shaped region 35: N-type doping of from $10^{17}$ to $10^{18}$ at./cm$^3$, selected according to the breakdown voltage desired in reverse biasing;

ring-shaped region 39: P-type doping on the order of $10^{19}$ at./cm$^3$.

In such conditions, a power diode which has a reverse voltage at 1 mA on the order of 16 V and a reverse voltage at one ampere on the order of 20 V, and a forward voltage drop at one ampere on the order of 400 mV is obtained.

It should be clear that the reverse characteristics of the PN diode are chosen so that, in reverse, this diode PN determines the characteristics of the diode according to the present invention.

Of course, the present invention is likely to have various alterations, modifications, and improvements which will readily occur to those skilled in the art. In particular, it will be within the abilities of those skilled in the art to adjust the doping levels and the depths of the different regions to the desired performances. Further, it has been previously considered that the diode is formed in a layer 32 resting on a substrate 31. However, those skilled in the art will understand that such different doping areas may be obtained by specific epitaxial and doping methods by diffusion/implantation in a massive substrate. Thus, layer 32 could result from a uniform doping of a semiconductor wafer and substrate 31 could result from an epitaxy and/or a specific implantation of the rear wafer surface.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A vertical rectifying and protection power diode, formed in a first semiconductor layer of a first conductivity type having a first doping concentration, resting on a substrate of the first conductivity type having a second doping concentration that is different than the first doping concentration, the vertical rectifying and protection power diode comprising:

a first ring-shaped region of the first conductivity type having a third doping concentration that is different than the first doping concentration and different from the second doping concentration, the first ring-shaped region surrounding an area of said first semiconductor layer and extending to form a first surface with the substrate;

a second ring-shaped region of a second conductivity type, extending from and covering a second surface of the first ring-shaped region that is opposite said first surface, extending laterally beyond the first ring-shaped region inward toward said area, and extending laterally beyond the first ring-shaped region outward away from said area;

a first electrode comprising a thin layer of a material that forms a Schottky diode with said first semiconductor layer, the first electrode physically contacting said area of said first semiconductor layer and physically contacting at least a portion of the second ring-shaped region, the first electrode forming an ohmic contact with the second ring-shaped region.

2. The diode of claim 1, wherein the first conductivity type is type N and the second conductivity type is type P.

3. The diode of claim 1, wherein the first doping concentration of the first semiconductor layer is smaller than the third doping concentration of the first region.

4. The diode of claim 1, wherein the first electrode forms an ohmic contact with the second ring-shaped region.

5. The diode of claim 1, wherein the first region is ring-shaped.

6. The diode of claim 1, wherein the Schottky diode has a forward voltage drop that is less than approximately 0.5 volts.

7. The diode of claim 6, wherein the forward voltage drop is approximately 400 millivolts.

8. The diode of claim 1, wherein a reverse breakdown characteristic of the diode is such that the diode has approximately a determined reverse breakdown voltage.

9. The diode of claim 1, wherein the diode is configured to be both a protection diode and a forward-conducting diode.

* * * * *

UNITED STATES PATENT AND TRADEMARK OFFICE
CERTIFICATE OF CORRECTION

PATENT NO. : 7,692,262 B2
APPLICATION NO. : 10/885996
DATED : April 6, 2010
INVENTOR(S) : Jean-Luc Morand et al.

It is certified that error appears in the above-identified patent and that said Letters Patent is hereby corrected as shown below:

Col. 1, line 60, should read:
However, in many applications among which are supply Col. 2, line 2, should read:
current, are altered. It is impossible, with Schottky diodes as Col. 2, line 4, should read:
or forward current behavior without disadvantageously Col. 2, line 19, should read:
ductivity type, resting on a heavily doped substrate of the first Col. 3, line 15, should read:
As illustrated in FIG. 3A, the method according to the Signed and Sealed this Eleventh Day of May, 2010

David J. Kappos
*Director of the United States Patent and Trademark Office*